United States Patent
Onituka

(10) Patent No.: US 7,513,284 B2
(45) Date of Patent: Apr. 7, 2009

(54) COMPRESSION DEVICE

(75) Inventor: Yasuto Onituka, Fukuoka (JP)

(73) Assignee: Panasonic Corporation, Osaka (JP)

( * ) Notice: Subject to any disclaimer, the term of this patent is extended or adjusted under 35 U.S.C. 154(b) by 571 days.

(21) Appl. No.: 10/566,791

(22) PCT Filed: Jan. 21, 2005

(86) PCT No.: PCT/JP2005/000784

§ 371 (c)(1),
(2), (4) Date: Jan. 31, 2006

(87) PCT Pub. No.: WO2005/071734

PCT Pub. Date: Aug. 4, 2005

(65) Prior Publication Data

US 2006/0243391 A1    Nov. 2, 2006

(30) Foreign Application Priority Data

Jan. 21, 2004    (JP)    ............................. 2004-012651

(51) Int. Cl.
*B32B 37/00*    (2006.01)
(52) U.S. Cl. ...................... 156/362; 156/580
(58) Field of Classification Search ................ 156/358, 156/362, 580, 581, 583.1; 100/315, 316, 100/324, 193, 208, 214, 237, 240
See application file for complete search history.

(56) References Cited

U.S. PATENT DOCUMENTS 6,019,153 A * 2/2000 Knokey ................ 156/502
6,056,841 A * 5/2000 Knokey ................ 156/228
6,558,590 B1 * 5/2003 Stewart ................ 264/40.5
7,081,219 B2 * 7/2006 Stewart ................ 264/40.5

FOREIGN PATENT DOCUMENTS

| JP | 8-114810 | 5/1996 |
| JP | 9-275115 | 10/1997 |
| JP | 2002-43369 | 2/2002 |
| JP | 2003-59975 | 2/2003 |
| JP | 2003-77957 | 3/2003 |
| JP | 2003-282653 | 10/2003 |

* cited by examiner

*Primary Examiner*—James Sells
(74) *Attorney, Agent, or Firm*—Pearne & Gordon LLP

(57) ABSTRACT

In a pressure bonding mechanism having a configuration in which a first pressure bonding tool 21A and a second pressure bonding tool 21B mounted on elevating rods 18A and 18B are elevated by a common numerically-controllable tool elevating mechanism 16 through an engagement member 17 so that pressure is applied to the pressure bonding tools by a first air cylinder 19A and a second air cylinder 19B respectively, the height positions of the pressure bonding surfaces of the first pressure bonding tool 21A and the second pressure bonding tool 21B in the state where the elevating rods 18A and 18B are in engagement with the engagement member 17 so as to regulate the lower limit positions of the elevating rods 18A and 18B are made different from each other. Thus, the pressure bonding tools can be brought into contact with substrates in turn respectively. It is therefore unnecessary to provide high-precision and high-cost elevating means individually for the pressure bonding tools.

8 Claims, 11 Drawing Sheets

COMPRESSION DEVICE

FIELD OF THE INVENTION

The present invention relates to a pressure bonding machine for pressing works such as electronic components or the like onto substrates to thereby pressure-bond the works to the substrates.

BACKGROUND ART

In assembly of a display panel such as a liquid crystal panel or the like, an electronic component for a driver is mounted on an edge portion of a substrate of glass or the like through an anisotropic conductive agent by pressure bonding. In this pressure bonding step, conductive particles in the anisotropic conductive agent have to be squashed under proper conditions. Therefore, a pressure bonding machine to be used for assembling a display panel requires an elevating mechanism by which a pressure bonding tool for abutting against an electronic component and pressing the electronic component is elevated with respect to the electronic component, or a pressure mechanism for controlling a pressure load on the electronic component precisely in the state where the pressure bonding tool abuts against the electronic component.

In recent years, a pressure bonding machine has been requested to cover a plurality of substrates simultaneously in order to improve the productivity (for example, see Patent Document 1). In an example of the prior art, two substrates are retained on a common panel support table, and a pressure bonding operation is performed upon these substrates on one and the same pressure bonding stage and by individual pressure bonding tools.

Patent Document 1: Japanese Patent Publication JP-A-2003-59975

DISCLOSURE OF THE INVENTION

Problem that the Invention is to Solve

However, the aforementioned prior-art example has a configuration in which individual elevating mechanisms and individual pressure mechanisms are provided for the pressure bonding tools respectively. Accordingly, the structure becomes so complicated that the equipment cost increases. Thus, there is a problem that it is difficult to perform a pressure bonding operation upon a plurality of substrates at a low cost and efficiently.

It is therefore an object of the present invention to provide a pressure bonding machine which can perform a pressure bonding operation upon a plurality of substrates at a low cost and efficiently.

Means for Solving the Problem

A pressure bonding machine according to the present invention is a pressure bonding machine for pressing pressure bonding surfaces of pressure bonding tools onto works to thereby perform a pressure bonding operation, including: a plurality of elevating portions which are mounted with the aforementioned pressure bonding tools and which ascends and descends independently of one another; a plurality of pressure generating means disposed individually for the aforementioned elevating portions and for applying downward pressure to the aforementioned pressure bonding tools through the aforementioned elevating portions; a single descending limit position regulating member for regulating descending limit positions of the aforementioned plurality of elevating portions; and an elevating means for elevating the aforementioned descending limit position regulating member so as to allow the aforementioned elevating portions to ascend/descend and bring the pressure bonding surfaces of the aforementioned pressure bonding tools into contact with the works; wherein height positions of the pressure bonding surfaces of the pressure bonding tools are made different from one another in a state where the descending limit positions of the plurality of elevating portions are regulated by the aforementioned descending limit position regulating member.

Effect of the Invention

According to the present invention, pressure bonding tools mounted on a plurality of independent elevating portions are designed to be elevated by a single elevating means through a single descending limit position regulating member. Height positions of the pressure bonding surfaces of the pressure bonding tools are made different from one another in a state where the descending limit positions of the plurality of elevating portions are regulated. Thus, a pressure bonding operation can be carried out on a plurality of substrates at a low cost and efficiently without necessity of providing elevating means individually for the pressure bonding tools.

BEST MODE FOR CARRYING OUT THE INVENTION

Figure 11:
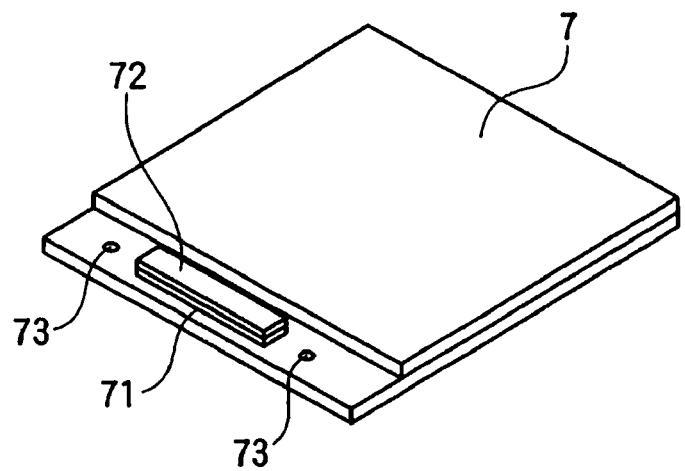
[FIG. 11] Explanatory views of works to be supported by a pressure bonding machine according to the present invention.
Figure 11:
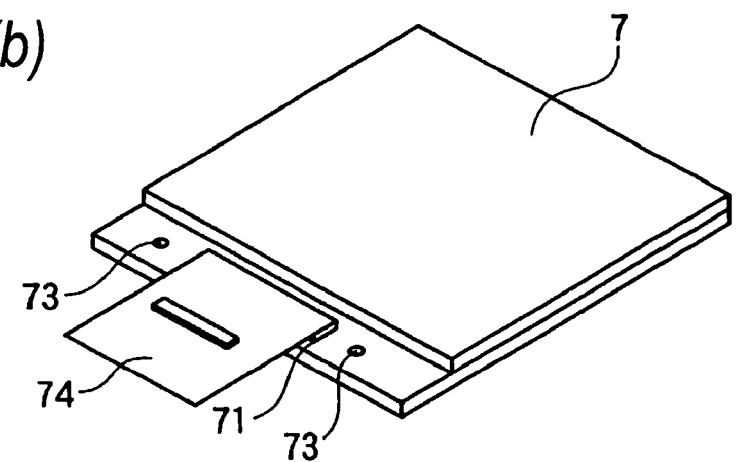
Figure 11:
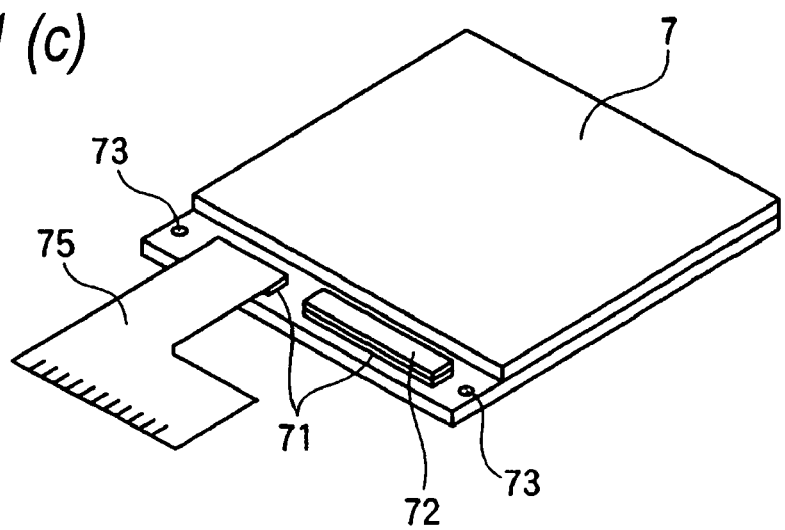

Next, an embodiment of the present invention will be described with reference to the drawings. A pressure bonding machine according to the present invention performs an operation as follows. That is, as a work to be subjected to a pressure bonding operation, an electronic component is mounted (pre-bonded) on a display panel (hereinafter abbreviated to "substrate" simply) in advance. A pressure bonding surface of a pressure bonding tool elevated by a tool elevating mechanism is pressed onto the electronic component so as to pressure-bond the electronic component to an edge portion of the substrate. In FIG. 11(a), a driver (electronic component) 72 for driving a display panel is mounted on an edge portion of a substrate 7 through an anisotropic conductive bonding agent 71. This driver 72 is a long and narrow rectangular parallelepiped type chip, which has been cut and separated from a semiconductor wafer, and pressure-bonded directly. The pressure bonding machine according to the present invention uses a pressure bonding tool to pressure-bond (strictly speaking, thermocompression-bond) the driver 72 to the display panel so as to bond the driver 72 to the substrate 7 through the anisotropic conductive bonding agent 71 hardened thermally. In addition, the pressure bonding machine according to the present invention is also used in the case where a tape carrier package type driver 74 mounted through the anisotropic conductive bonding agent 71 is to be pressure-bonded to the display panel 7 as shown in FIG. 11(b). Further, the pressure bonding machine according to the present invention is also used in the case where another electronic component than the driver, that is, a connector 75 for electrically connecting the display panel to another circuit module is to be pressure-bonded to the display panel as shown in FIG. 11(c). This connector 75 is also connected to the display panel through the anisotropic conductive bonding agent 71.

Figure 1:
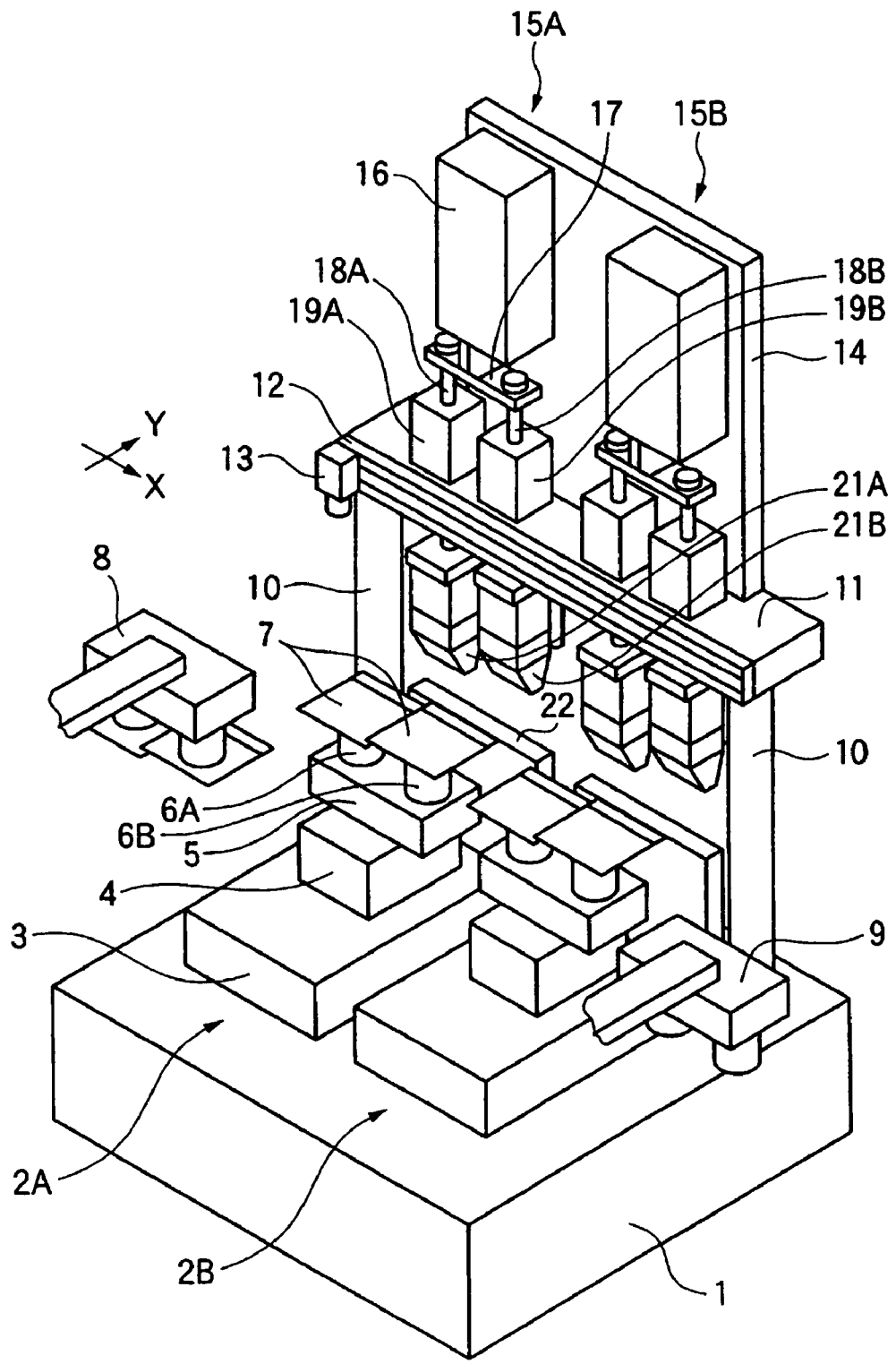
[FIG. 1] A perspective view of a pressure bonding machine according to an embodiment of the present invention.
Figure 2:
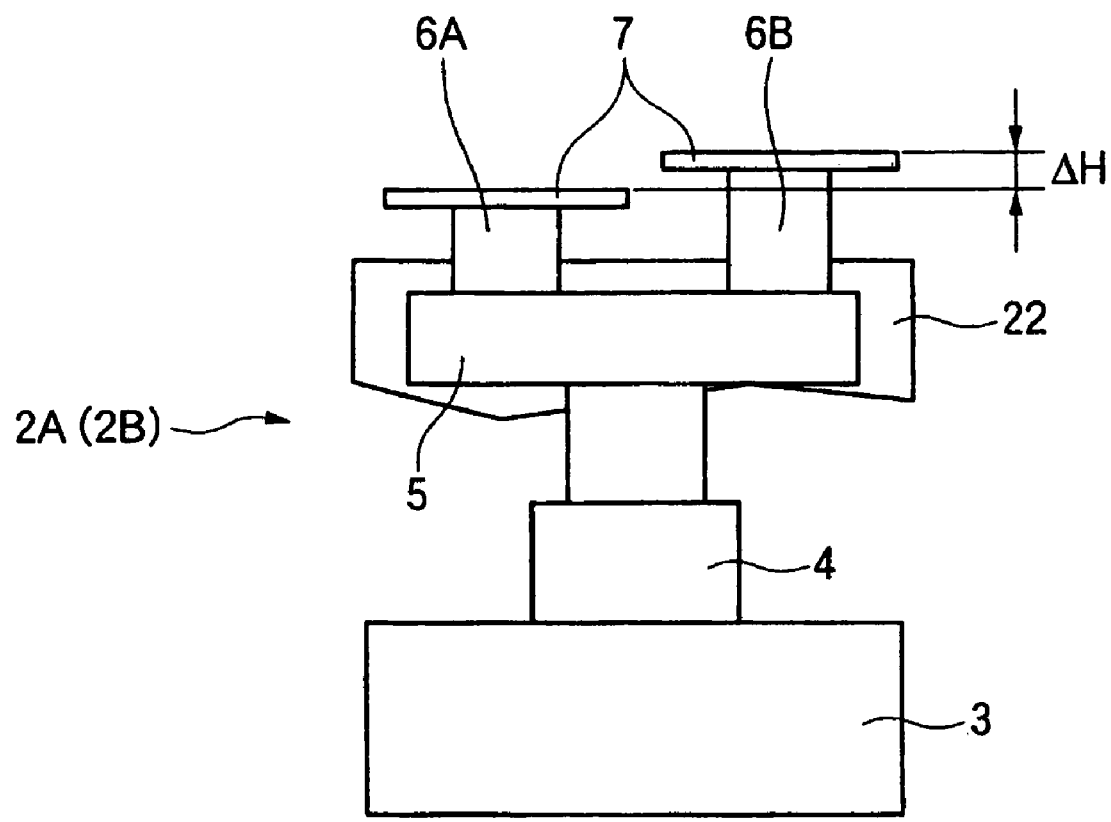
[FIG. 2] A front view of a substrate retention portion in the pressure bonding machine according to the embodiment of the present invention.

In FIG. 1, a first table unit 2A and a second table unit 2B are arrayed in an X direction on a pedestal 1. The first table unit 2A and the second table unit 2B have one and the same configuration. In the configuration, as shown in FIG. 2, a Z table mechanism 4 is disposed on an XY table mechanism 3 so that an elevating stage 5 can be elevated by the Z table mechanism 4. A first substrate retention portion 6A and a second substrate retention portion 6B are provided on the top of the elevating stage 5. The first substrate retention portion 6A and the second substrate retention portion 6B retain substrates 7 to be pressure-bonded, at their tops by vacuum suction respectively. The elevating stage 5, the first substrate retention portion 6A and the second substrate retention portion 6B serve as a substrate retention means for retaining a plurality of substrates 7. A horizontally rotating mechanism 5a (see FIG. 5, but not shown in detail) for horizontally rotating the first substrate retention portion 6A and the second substrate retention portion 6B is built in the elevating stage 5. As the horizontally rotating mechanism, a mechanism disclosed in Japanese Patent Publication JP-A-9-275115/(1997) or the like is available. Thus, the horizontal in-plane directions of the substrates retained by the first substrate retention portion 6A and the second substrate retention portion 6B are changed and adjusted. In this embodiment, the XY table mechanism 3 and the horizontally rotating mechanism constitute a substrate positioning mechanism. On the other hand, the Z table mechanism 4 serves as a substrate elevating mechanism for elevating the first substrate retention portion 6A and the second substrate retention portion 6B. In this embodiment, the two substrate retention portions 6A and 6B are elevated by the single Z table mechanism 4. However, a structure including Z table mechanisms dedicated to the substrate retention portions respectively may be used.

Here, the substrate retention levels of the first substrate retention portion 6A and the second substrate retention portion 6B are not the same but only the second substrate retention portion 6B is set to be higher by ΔH. When there is a difference in substrate retention level among a plurality of substrate retention portions in such a manner, each substrate 7 where electronic components to be pressure-bonded are mounted on a plurality of sides of the substrate 7 can be prevented from interfering with another adjacent substrate when the substrate 7 is rotated in a horizontal plane. Thus, there is an advantage that the array pitch between adjacent substrate retention portions can be shortened so that the machine size can be reduced. In this embodiment, as will be described later, the height of the pressure bonding surface of a pressure bonding tool corresponding to each substrate retention portion is set in accordance with this difference in substrate retention level.

The pressure bonding machine has a substrate carrying-in head 8 and a substrate carrying-out head 9 as shown in FIG. 1. Each of the substrate carrying-in head 8 and the substrate carrying-out head 9 sucks and retains two substrates 7 simultaneously so as to keep an interval equal to the array pitch between the first substrate retention portion 6A and the second substrate retention portion 6B and keep the aforementioned difference ΔH in level. Two substrates 7 carried in from the upstream side by the substrate carrying-in head 8 are mounted on the first substrate retention portion 6A and the second substrate retention portion 6B of the table unit 2A or the table unit 2B. The substrates 7 subjected to a pressure bonding operation by the table unit 2A or the table unit B are carried out to the downstream side simultaneously by the substrate carrying-out head 9.

On the pedestal 1, two support posts 10 are provided erectly behind the first table unit 2A and the second table unit 2B. These support posts 10 support a base portion 11 disposed horizontally. On the front surface of the base portion 11, a camera 13 for picking up an image of a recognition mark 73 (see FIG. 11) of each substrate 7 is disposed to be moved desirably in the X direction by a camera moving table 12. When the camera 13 is moved in the X direction by the camera moving table 12, an image of any one of the substrates 7 retained by the first substrate retention portions 6A and the second substrate retention portions 6B of the first table unit 2A and the second table unit 2B can be picked up.

Figure 5:
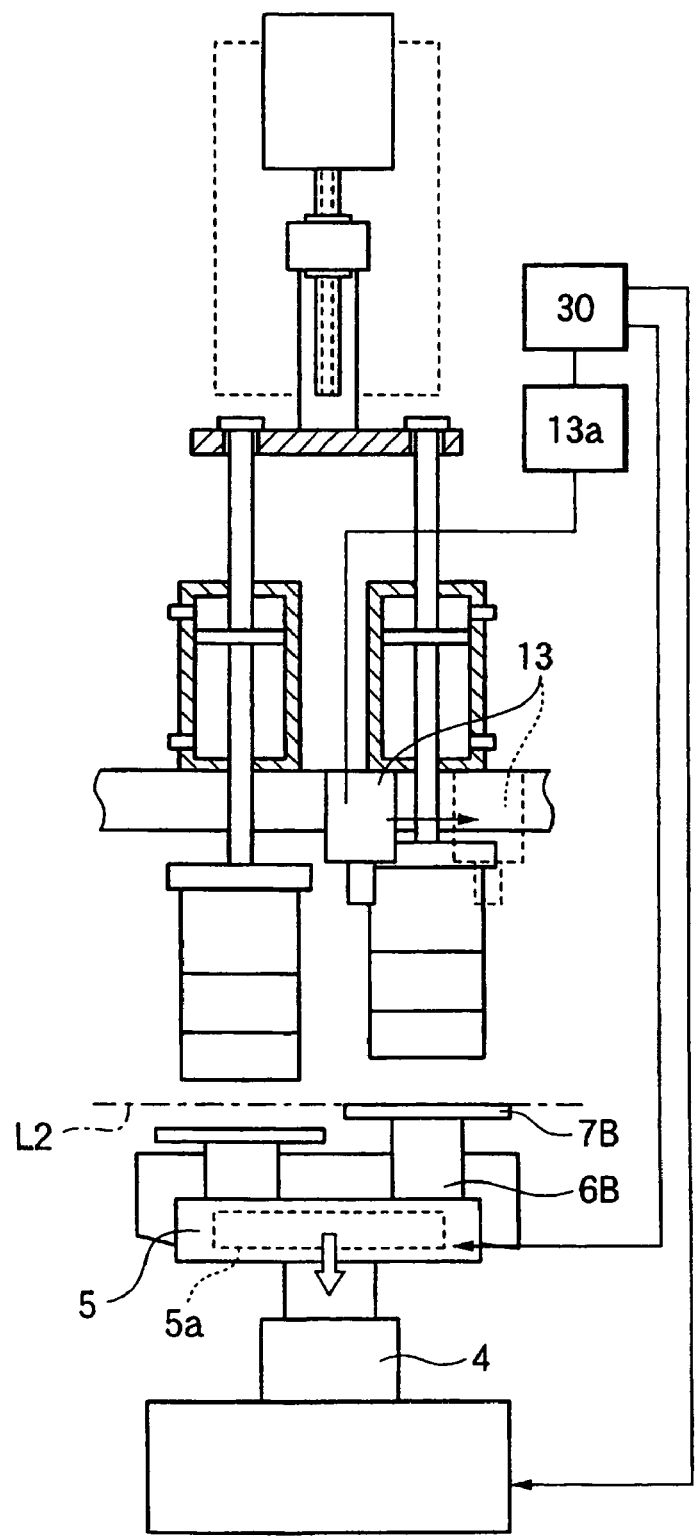
[FIG. 5] An operation explanatory view of the pressure bonding operation by the pressure bonding machine according to the embodiment of the present invention.

In FIG. 5, the camera 13 is connected to a recognition portion 13a. The recognition portion 13a recognizes a recognition mark from image data sent from the camera 13, and detects the position of a substrate. The recognition portion 13a is connected to a control portion 30. A position detection result obtained by the recognition portion 13a is sent to the control portion 30. Based on the position detection result, the control portion 30 controls the operation of the XY table mechanism 3 or the horizontally rotating mechanism 5a built in the elevating stage 5, so that edge portions of the substrates 7 retained by the respective substrate retention portions are positioned in pressure bonding operation positions on a lower guard member 22, that is, positions where pressure bonding operation will be performed by a first pressure bonding tool 21A and a second pressure bonding tool 21B, as will be described below. Thus, the camera 13 and the recognition portion 13a serve as a substrate recognizing means for detecting the positions of the substrates, and the control portion 30 serves as a positioning control means for controlling the substrate positioning mechanism based on the position recognition result of the substrate recognition means. Incidentally, here, there is shown an example in which the lower guard member 22 is formed as an integrated structure to be shared by both the first pressure bonding tool 21A and the second pressure bonding tool 21B. However, lower guard members may be provided individually for the first pressure bonding tool 21A and the second pressure bonding tool 21B.

In FIG. 1, a vertical frame 14 which is vertical is provided erectly on the base portion 11. A first pressure bonding portion 15A and a second pressure bonding portion 15B each having two pressure bonding tools, that is, the first pressure bonding tool 21A and the second pressure bonding tool 21B, are disposed on the front surface of the vertical frame 14. The first pressure bonding portion 15A and the second pressure bonding portion 15B have one and the same mechanism, including a tool elevating mechanism 16 for elevating the first pressure bonding tool 21A and the second pressure bonding tool 21B, and first and second air cylinders 19A and 19B for applying pressure to the first and second pressure bonding tools 21A and 21B respectively.

Figure 3:
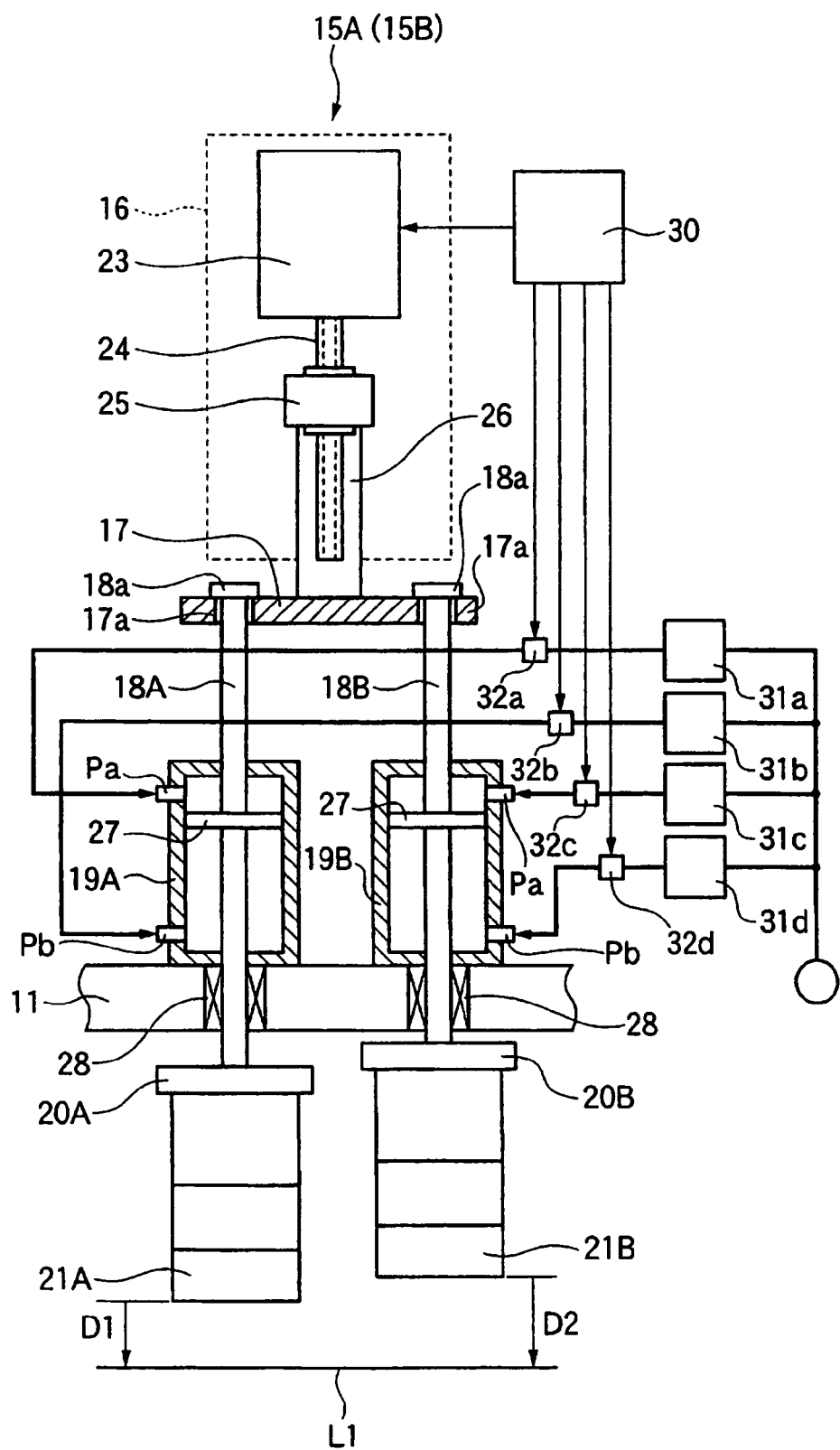
[FIG. 3] A mechanism explanatory view of an elevating mechanism and a pressure mechanism in the pressure bonding machine according to the embodiment of the present invention.

The detailed structure of the first pressure bonding portion 15A (the second pressure bonding portion 15B) will be described with reference to FIG. 3. In FIG. 3, the tool elevating mechanism 16 has a configuration in which an elevating member 26 is elevated by a linear motion mechanism constituted by a motor 23 numerically controlled by the control portion 30, a feed screw 24 and a nut 25. A horizontal plate-like engagement member 17 is engaged with a lower end portion of the elevating member 26. Insertion holes 17a are provided in opposite, left and right end portions of the engagement member 17. Elevating rods 18A and 18B are inserted into the insertion holes 17a respectively.

An engagement portion 18a having a larger diameter size than the insertion hole 17a is provided in an upper end portion of each elevating rod 18A, 18B. The descending limit position of each elevating rod 18A, 18B is regulated by the engagement portion 18a. That is, the elevating rod 18A and the elevating rod 18B are inserted into the insertion holes 17a respectively so that they can ascend and descend desirably independently of each other. However, when the engagement portion 18a descends to the position where the engagement portion 18a abuts against the upper surface of the engagement member 17, the elevating rod 18A or the elevating rod 18B corresponding to the engagement portion 18a is brought into an engagement state where its more descending is regulated.

The first air cylinder 19A and the second air cylinder 19B are disposed on the top of the base portion 11. The elevating rods 18A and 18B are designed to be coupled with pistons 27 in the first air cylinder 19A and the second air cylinder 19B respectively so that piston rods moving up/down are extended in the up/down direction. The lower portions of the elevating rods 18A and 18B are guided in the up/down motion direction by elevating guides 28 provided in the base portion 11, respectively. The tool retention portions 20A and 20B are coupled with the lower end portions of the elevating rods 18A and 18B respectively. The first pressure bonding tool 21A and the second pressure bonding tool 21B are mounted on the tool retention portions 20A and 20B respectively.

In the aforementioned configuration, the elevating rod 18A and the tool retention portion 20A coupled therewith serve as one elevating portion (first elevating portion), while the elevating rod 18B and the tool retention portion 20B coupled therewith serve as another elevating portion (second elevating portion). The elevating portions are disposed side by side above the lower guard member 22, and mounted on the base portion 11 movably up/down independently of each other. The engagement member 17 has a function as a single descending limit position regulating member for regulating the lower limit positions of a plurality of elevating portions when it is in an engagement state with the elevating portions. Here, the engagement state means the state where the engagement portion 18a abuts against the upper surface of the engagement member 17 so that the descending of the elevating rod 18A, 18B is regulated.

When the motor 23 of the tool elevating mechanism 16 is driven, the elevating member 26 ascends/descends together with the engagement portion 17 so that the elevating rods 18A and 18B ascend/descend together with the first pressure bonding tool 21A and the second pressure bonding tool 21B. When these pressure bonding tools ascend/descend, the pressure bonding surfaces of the lower surfaces of the pressure bonding tools abut against the substrates 7 to be subjected to a pressure bonding operation, or leave the substrates 7. Accordingly, the tool elevating mechanism 16 serves as an elevating means for elevating the engagement member 17 serving as the lower limit position regulating member so as to elevate the elevating rods 18A and 18B serving as elevating portions, and bring the pressure bonding surfaces of the first pressure bonding tool 21A and the second pressure bonding tool 21B into contact with works respectively.

Here, the motor 23 can be numerically controlled by the control portion 30. The intended height position of the engagement member 17 to be controlled when the engagement member 17 is elevated by the tool elevating mechanism 16 can be specified by a specific numerical value (for example, a distance between the pressure bonding surface of the pressure bonding tool and a pressure bonding level L1 as shown in FIG. 3). That is, the tool elevating mechanism 16 serves as an elevating means which can control the height position of the engagement member 17 by numerical control.

Regulators 31a, 31b, 31c and 31d are connected to a pressure port Pa and a return port Pb of the first air cylinder 19A and a pressure port Pa and a return port Pb of the second air cylinder 19B through control valves 32a, 32b, 32c and 32d respectively. Further, the regulators 31a, 31b, 31c and 31d are connected to an air pressure source 33. When the control valves 32a, 32b, 32c and 32d are controlled by the control portion 30, air pressure supply to the pressure ports Pa and the return ports Pb of the first air cylinder 19A and the second air cylinder 19B are controlled.

That is, when air pressure is supplied to the pressure ports Pa, pressure based on the air pressure applied to the pistons 27 acts as downward pressure on the pressure bonding tools through the elevating rods 18A and 18B respectively. Thus, the first air cylinder 19A and the second air cylinder 19B serve as a plurality of pressure generating means disposed individually for the elevating portions and for applying downward pressure to the pressure bonding tools through the elevating portions. In this event, desired pressure can be obtained by adjusting the set pressure of the regulators 31a and 31c. Incidentally, linear motors, voice coil motors, etc. other than the air cylinders can be used as the pressure generating means. However, the air cylinders are the most suitable in terms of the machine cost, the operation stability, the easiness of adjustment work, etc.

Here, there is shown a mode in which the pressure generating means are air cylinders including piston rods ascending/descending as parts of the elevating rods 18A and 18B, while the piston rods are included in the aforementioned elevating portions. Further, there is a mode in which the pressure bonding tool 21A and the pressure bonding tool 21B are mounted on the lower end portions of the elevating rods 18A and 18B from which the piston rods extend downward, while the engagement member 17 serving as a descending limit position regulating member is engaged with the upper end portions of the elevating rods 18A and 18B.

As shown in FIG. 3, in the state where the elevating rod 18A and the elevating rod 18B engage with the engagement member 17 so that their lower limit positions are regulated, distances D1 and D2 from the pressure bonding surfaces of the pressure bonding tool 21A and the pressure bonding tool 21B to the pressure bonding level L1 are set so that the distance D2 is longer. Here, the pressure bonding level L1 is a height level of the upper surface of each substrate 7 in the state where the lower surface thereof is supported on the upper surface of the lower guard member 22. That is, this embodiment has a mode in which the height positions of the pressure bonding surfaces of the pressure bonding tools are made different from each other in the state where the lower limit positions of a plurality of elevating portions are regulated by the descending limit position regulating member. Here, as for the setting of the distances D1 and D2, the sizes of the elevating rod 18A and the elevating rod 18B are set (see FIG. 6) so that D2-D1 becomes larger than the aforementioned substrate retention level difference ΔH (see FIG. 2).

When a plurality of pressure bonding tools having different height positions of their pressure bonding surfaces are moved down simultaneously by the tool elevating mechanism 16, the pressure bonding tool having a lower pressure bonding surface (the first pressure bonding tool 21A in the example shown in FIG. 3) abuts against the upper surface of the substrate located on the pressure bonding level L1 earlier, and the pressure bonding tool cannot descend any more. When the engagement member 17 is further moved down by the tool elevating mechanism 16 in this state, the engagement member 17 descends in the state where the engagement member 17 leaves the engagement portion 18a of the elevating rod 18A. That is, when a descending operation using the elevating means is continued further after the pressure bonding tool abuts against the work so that the pressure bonding tool cannot descend any more, the engagement between the elevating portion mounted with that pressure bonding tool and the descending limit position regulating member is released.

This pressure bonding machine is configured as described above. Description will be made below about a pressure bonding operation carried out on a plurality of substrates 7. Here, description is made about the case where two substrates 7 (here, a substrate 7A (first substrate) and a substrate 7B (second substrate) distinguished by their suffixes) retained on one table unit 2A are subjected to a pressure bonding operation performed by the first pressure bonding portion 15A. In addition, electronic components such as drivers, anisotropic conductive bonding agents and recognition marks mounted on edge portions of the substrates are not shown in FIGS. 4-10.

Figure 4:
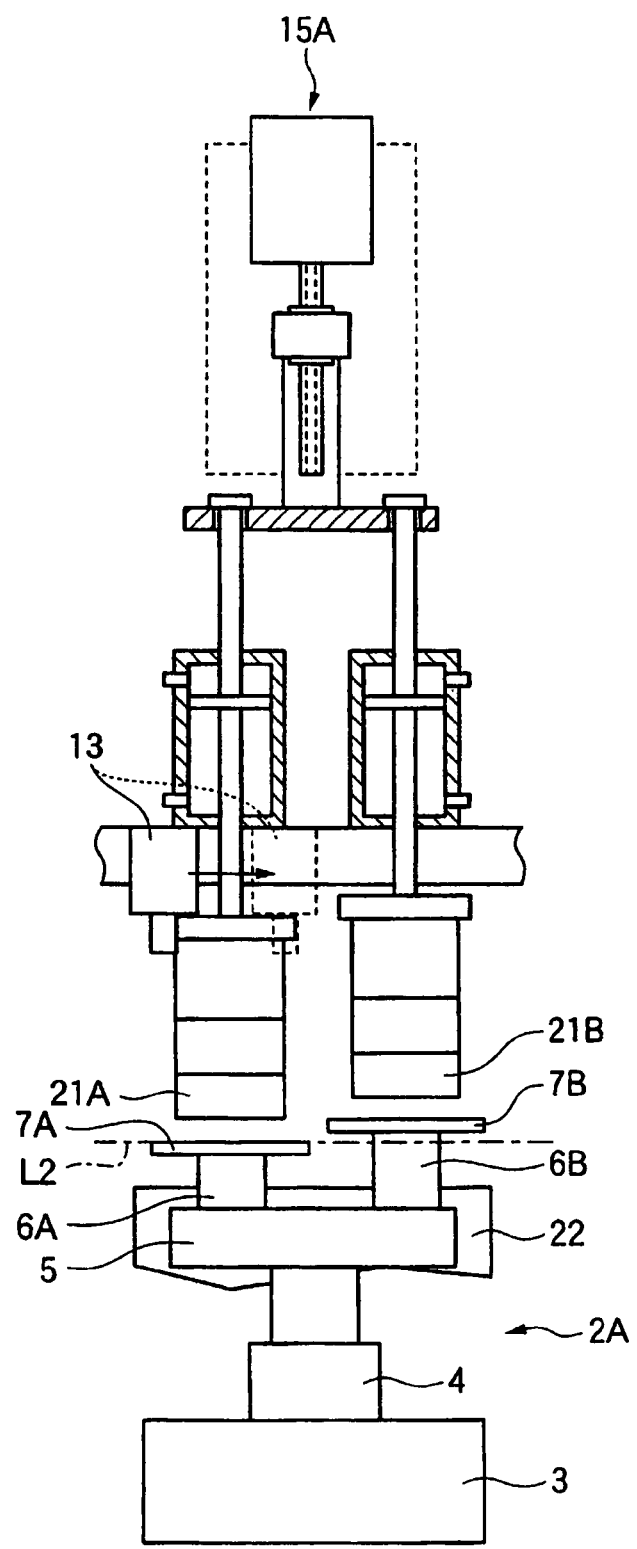
[FIG. 4] An operation explanatory view of a pressure bonding operation by the pressure bonding machine according to the embodiment of the present invention.

First, FIG. 4 shows the state where the substrate 7A and the substrate 7B are mounted on the first substrate retention portion 6A and the second substrate retention portion 6B in the table unit 2A by the substrate carrying-in head 8, and an edge portion of the substrate 7A and an edge portion of the substrate 7B are positioned between the lower guard member 22 and the first pressure bonding tool 21A and between the lower guard member 22 and the second pressure bonding tool 21B respectively by the XY table mechanism 3. The reference sign L2 illustrated in the drawing designates the image pickup height level with which the camera 13 picks up an image. In the state shown in FIG. 4, the upper surface of the substrate 7A is aligned with the image pickup height level L2.

After that, an image of the recognition mark of the substrate 7A is picked up while the camera 13 is moved in the X direction. The recognition mark is recognized by the recognition portion so that the positions of the substrate 7A and the substrate 7B are detected. An alignment operation for aligning an edge portion of the substrate 7A with a pressure bonding operation position is performed based on this position detection result.

After that, the substrate 7B is positioned successively. That is, as shown in FIG. 5, the camera 13 is moved in the X direction so as to be located above the substrate 7B retained by the second substrate retention portion 6B. Therewithal, the Z table mechanism 4 is driven to move down the elevating stage 5. Thus, the upper surface of the substrate 7B is aligned with the image pickup height level 2. An image of the recognition mark of the substrate 7B is picked up while the camera 13 is moved. The position of the substrate 7B is detected in the same manner.

Figure 6:
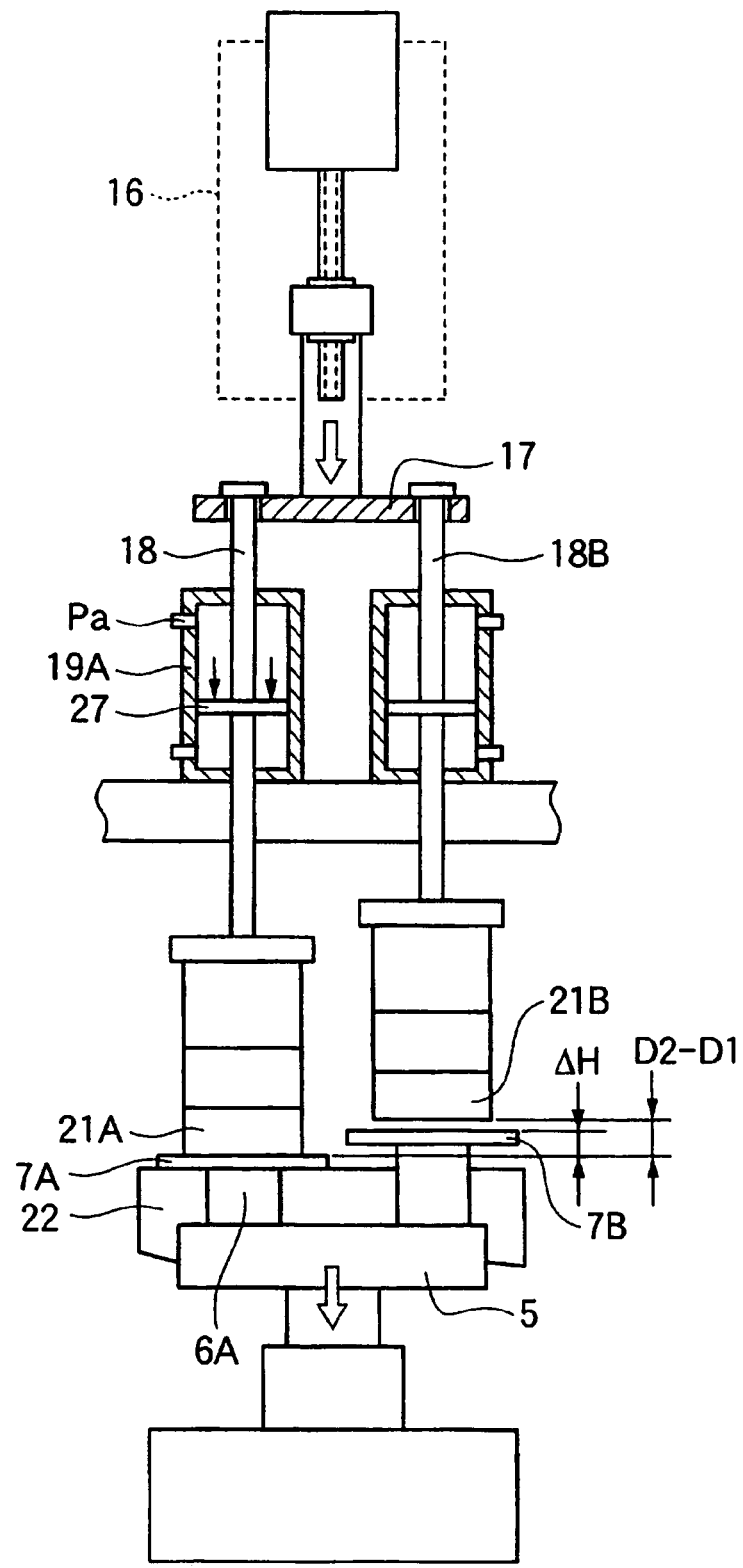
[FIG. 6] An operation explanatory view of the pressure bonding operation by the pressure bonding machine according to the embodiment of the present invention.

After that, pressure bonding of the substrate 7A is started. That is, as shown in FIG. 6, first, the elevating stage 5 is further moved down so that the lower surface of the substrate 7A retained by the first substrate retention portion 6A is landed on the lower guard member 22. Next, the engagement member 17 is moved down by the distance D1 shown in FIG. 3 by the tool elevating mechanism 16. Incidentally, air pressure necessary to generate pressure required for pressure bonding is supplied from the pressure ports Pa of the first air cylinder 19A and the second air cylinder 19B before the time when the engagement member 17 is moved down.

As a result, the elevating rod 18A engaging with the engagement member 17 descends by the distance D1 in the same manner, so that the first pressure bonding tool 21A lands on the substrate 7A. When the engagement member 17 is further moved down slightly, the engagement portion 18a of the elevating rod 18A leaves the upper surface of the engagement member 17 so that the elevating rod 18A with the first bonding tool 21A abutting against the substrate 7A is released from engagement with the engagement member 17. In this state, the pressure acting on the piston 27 of the first air cylinder 19A is transmitted to the pressure bonding tool 21A through the elevating rod 18A so that an electronic component (not shown) mounted on the substrate 7A in advance is pressure-bonded to the substrate 7A.

In this event, as described previously, the sizes of the elevating rods 18A and 18B are set so that the level difference D2-D1 between the pressure bonding surfaces of the first pressure bonding tool 21A and the second pressure bonding tool 21B becomes larger than the aforementioned substrate retention level difference ΔH. Therefore, the second pressure bonding tool 21B cannot land on the substrate 7B in this state.

Figure 7:
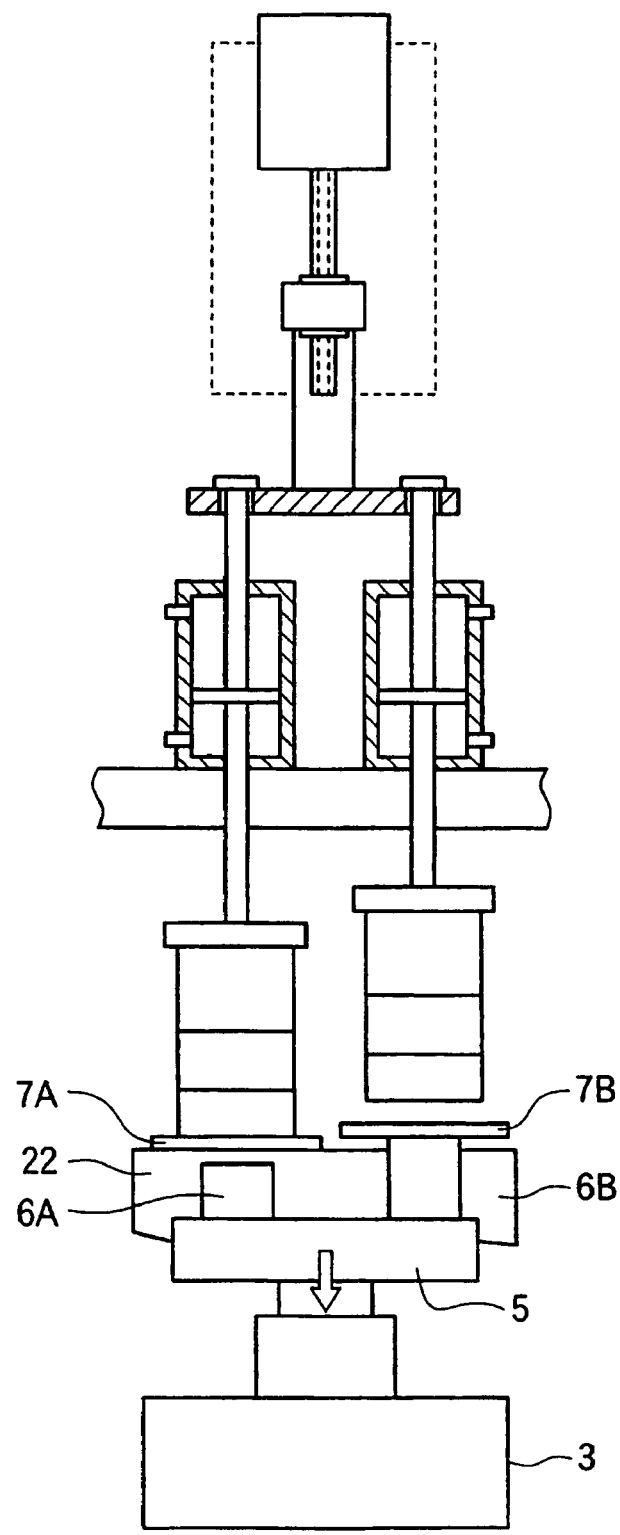
[FIG. 7] An operation explanatory view of the pressure bonding operation by the pressure bonding machine according to the embodiment of the present invention.

After that, an alignment operation of the substrate 7B is performed. To this end, first, the vacuum suction of the substrate 7A by the first substrate retention portion 6A is released. Then, as shown in FIG. 7, the elevating stage 5 is moved down to leave the retention surface of the first substrate retention portion 6A from the lower surface of the substrate 7A. Consequently, only the second substrate retention portion 6B can be moved by the XY table mechanism 3, the horizontally rotating mechanism and the Z table mechanism 4. The edge portion of the substrate 7B is aligned with a pressure bonding operation position based on the position detection result of the substrate 7B detected in FIG. 5.

Figure 8:
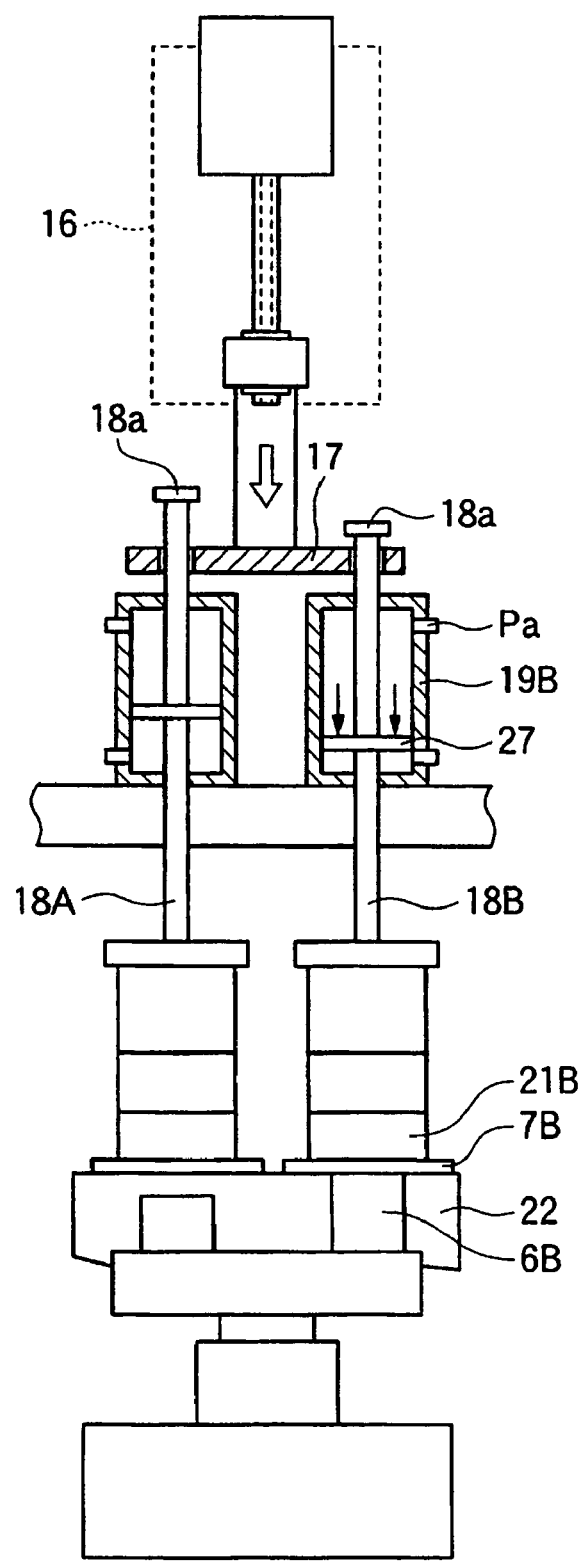
[FIG. 8] An operation explanatory view of the pressure bonding operation by the pressure bonding machine according to the embodiment of the present invention.

After that, pressure bonding of the substrate 7B is started. That is, as shown in FIG. 8, first, the elevating stage 5 is further moved down, so that the lower surface of the substrate 7B retained by the second substrate retention portion 6B is landed on the lower guard member 22. Next, when the engagement member 17 is moved down by the distance D2 shown in FIG. 3 by the tool elevating mechanism 16, the elevating rod 18B keeping in engagement with the engagement member 17 descends together with the engagement member 17 so that the second pressure bonding tool 21B lands on the substrate 7B. When the engagement member 17 is then further moved down, the engagement portion 18a of the elevating rod 18B leaves the upper surface of the engagement member 17. As a result, engagement between the elevating rod 18B and the engagement member 17 is released. In this state, the tool elevating mechanism 16 stops moving down the engagement member 17. In this state, the pressure acting on the piston 27 of the second air cylinder 19B is transmitted to the pressure bonding tool 21B through the elevating rod 18B so as to start a pressure bonding operation in which an electronic component (not shown) mounted on the substrate 7B in advance is pressed onto the substrate 7B. After that, when a predetermined pressure bonding time which has been set in advance has passed, the operation of pressure bonding performed on the substrate 7A and the substrate 7B is completed.

Figure 9:
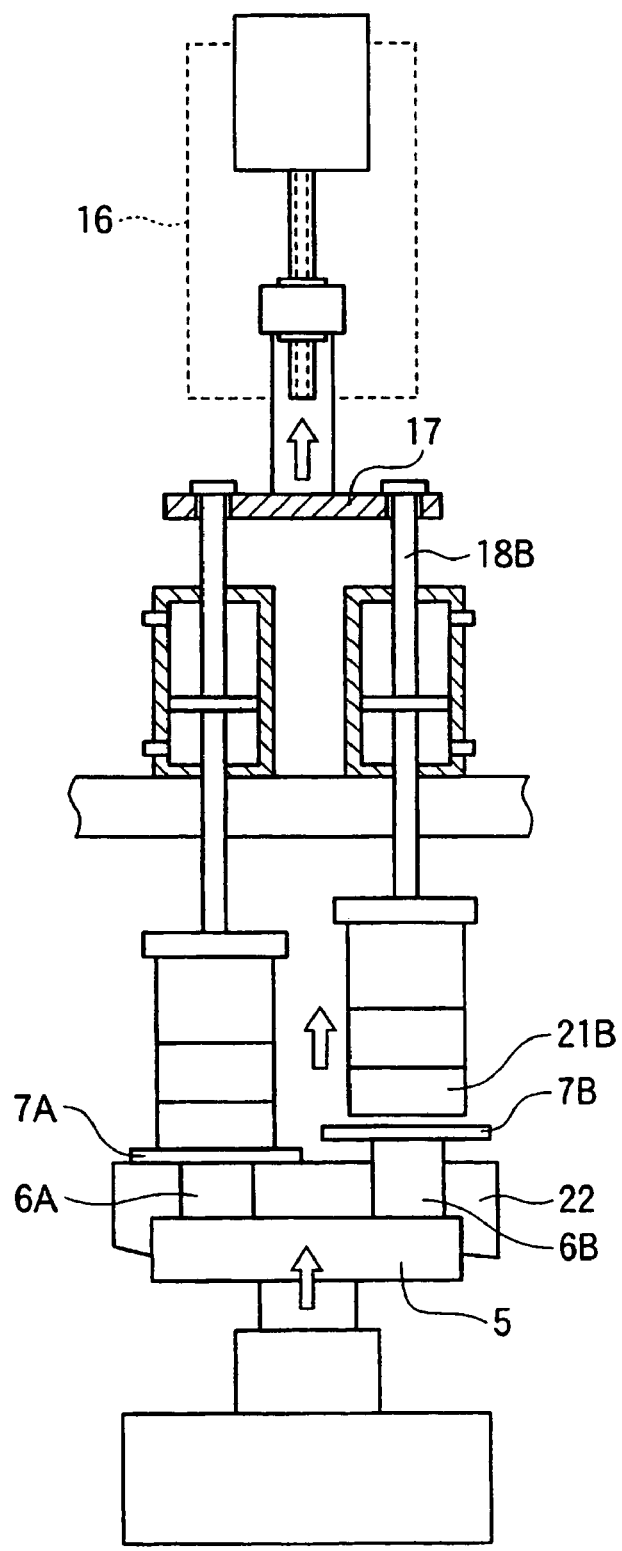
[FIG. 9] An operation explanatory view of the pressure bonding operation by the pressure bonding machine according to the embodiment of the present invention.

After that, an operation for retaining the pressure-bonded substrates 7A and 7B by the substrate retention portions respectively is started. First, as shown in FIG. 9, the engagement member 17 is moved up by the tool elevating mechanism 16 so as to first engage the elevating rod 18B with the engagement member 17 and move up the elevating rod 18B. Consequently, the pressure bonding tool 21B leaves the upper surface of the substrate 7B. Next, the elevating stage 5 is moved up to leave the substrate 7B on the second substrate retention portion 6B from the lower guard member 22 and to bring the retention surface of the first substrate retention portion 6A into contact with the lower surface of the substrate 7A so as to suck and retain the substrate 7A.

Figure 10:
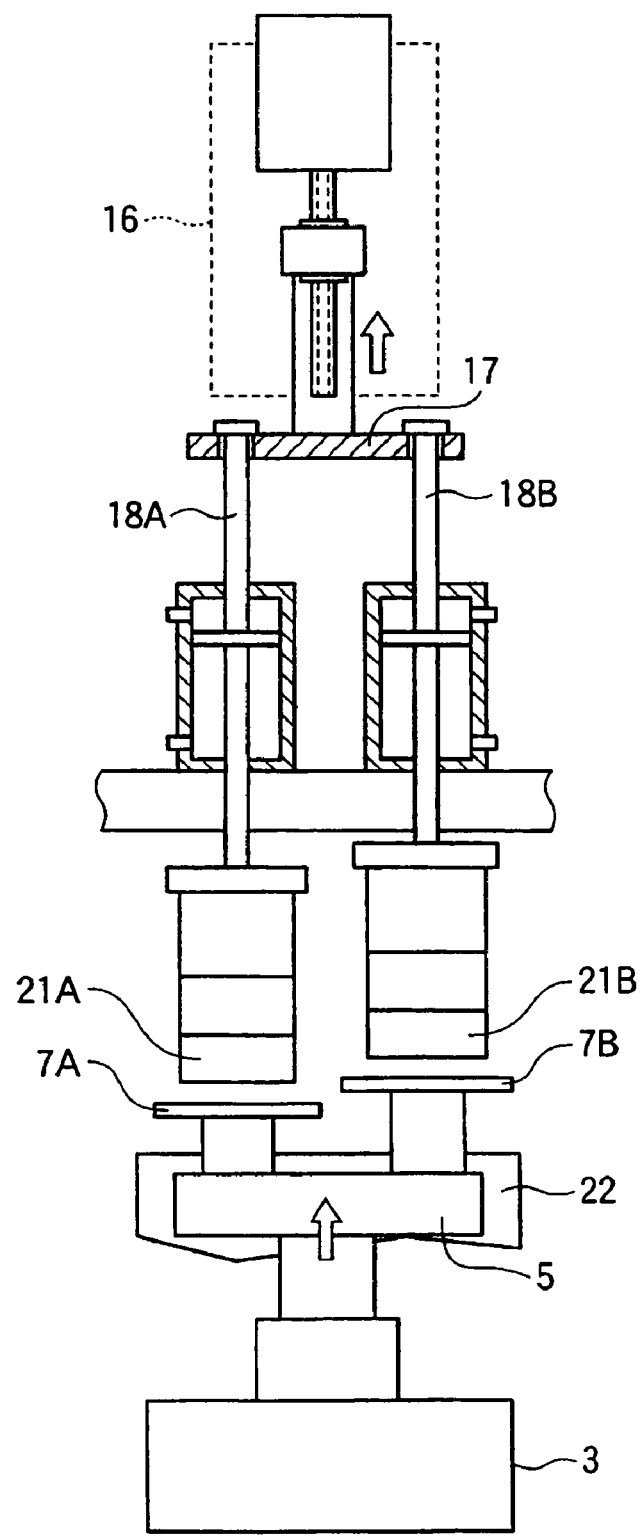
[FIG. 10] An operation explanatory view of the pressure bonding operation by the pressure bonding machine according to the embodiment of the present invention.

After that, the engagement member 17 is further moved up by the tool elevating mechanism 16 so that both the elevating rods 18A and 18B are moved up by the engagement member 17 as shown in FIG. 10. As a result, the first pressure bonding tool 21A and the second pressure bonding tool 21B are separated from the substrates 7A and 7B respectively. Next, when the elevating stage 5 is moved up to leave the substrate 7A from the upper surface of the lower guard member 22, the substrates 7A and 7B retained by the first substrate retention portion 6A and the second substrate retention portion 6B can be moved from the pressure bonding operation positions to position where they will be carried out by the substrate carrying-out head 9. After that, the XY table mechanism 3 is driven to move the first substrate retention portion 6A and the second substrate retention portion 6B to the near side, and the substrate 7A and the substrate 7B are carried out by the substrate carrying-out head 9.

As has been described above, the pressure bonding machine according to the present invention has a configuration in which the first pressure bonding tool 21A and the second pressure bonding tool 21B mounted on a plurality of independent elevating rods 18A and 18B are elevated through the engagement member 17 by the common numerically controllable tool elevating mechanism 16. The height positions of the pressure bonding surfaces of the first pressure bonding tool 21A and the second pressure bonding tool 21B are made different from each other in the state where the elevating rods 18A and 18B engage with the engagement portion 17 so as to regulate the descending limit positions of the elevating rods 18A and 18B.

Consequently, in the procedure in which the first pressure bonding tool 21A and the second pressure bonding tool 21B whose pressure bonding surfaces are different in height position from each other are moved down by the tool elevating mechanism 16, the pressure bonding surfaces of the first pressure bonding tool 21A and the second pressure bonding tool 21B can be brought into contact with the substrates 7A and 7B to be pressure-bonded, accurately in turn. Thus, a pressure bonding operation can be carried out on a plurality of substrates at a low cost and efficiently without necessity of providing high-accuracy and high-cost elevating means individually for the pressure bonding tools.

Although the present invention has been described in detail and with reference to its specific embodiment, it is obvious to those skilled in the art that various changes or modifications can be made on the present invention without departing from the spirit and scope thereof.

The present application is based on a Japanese patent application (Japanese Patent Application No. 2004-012651) filed on Jan. 21, 2004, the contents of which are incorporated herein by reference.

INDUSTRIAL APPLICABILITY

A pressure bonding machine according to the present invention has an effect that a pressure bonding operation can be carried out on a plurality of substrates at a low cost and efficiently without necessity of providing elevating means individually for pressure bonding tools. It is applicable to a pressure bonding machine in which works such as electronic components or the like are pressed onto substrates and pressure-bonded thereto.

The invention claimed is:

1. A pressure bonding machine for pressing pressure bonding surfaces of pressure bonding tools onto works to thereby perform a pressure bonding operation, comprising:
 a plurality of elevating portions which are mounted with said pressure bonding tools and which ascends and descends independently of one another;
 a plurality of pressure generating means disposed individually for said elevating portions and for applying downward pressure to said pressure bonding tools through said elevating portions;
 a single descending limit position regulating member for regulating descending limit positions of said plurality of elevating portions; and
 an elevating means for elevating said descending limit position regulating member so as to allow said elevating portions to ascend/descend and bring said pressure bonding surfaces of said pressure bonding tools into contact with said works;
 wherein height positions of said pressure bonding surfaces of said pressure bonding tools are made different from one another in a state where said descending limit positions of said plurality of elevating portions are regulated by said descending limit position regulating member.

2. A pressure bonding machine according to claim 1, wherein said elevating means controls a height position of said descending limit position regulating member.

3. A pressure bonding machine according to claim 1, wherein said pressure generating means are air cylinders having elevating piston rods, and said piston rods form parts of said elevating portions respectively.

4. A pressure bonding machine according to claim 3, wherein said pressure bonding tools are mounted on lower end portions of said piston rods respectively, and said descending limit position regulating member is engaged with upper end portions of said piston rods.

5. A pressure bonding machine according to claim 1, wherein when a descending operation is further continued by said elevating means after one of said pressure bonding tools abuts against corresponding one of said works so that said pressure bonding tool cannot descend, engagement between said elevating portion mounted with said pressure bonding tool and said descending limit position regulating member is released.

6. A pressure bonding machine for performing a pressure bonding operation, said pressure bonding machine pressing pressure bonding surfaces of pressure bonding tools onto electronic components mounted on edge portions of substrates so as to pressure-bond said electronic components to said substrates, comprising:

a first substrate retention portion and a second substrate retention portion for retaining one of said substrates at a higher position than said first substrate retention portion does;

a lower guard member for supporting, from below, an edge portion of a first substrate retained by said first substrate retention portion and an edge portion of a second substrate retained by said second substrate retention portion;

a first elevating portion mounted in its lower end portion with a first pressure bonding tool and disposed above said lower guard member;

a second elevating portion mounted in its lower end portion with a second pressure bonding tool and disposed above said lower guard member and alongside of said first elevating portion;

a substrate positioning mechanism for horizontally moving said substrate retention portions so that said edge portion of said first substrate retained by said first substrate retention portion is positioned between said substrate lower guard member and said first pressure bonding tool and said edge portion of said second substrate retained by said second substrate retention portion is positioned between said substrate lower guard member and said second pressure bonding tool;

a substrate elevating mechanism for elevating said substrate retention portions individually so that said edge portion of said first substrate retained by said first substrate retention portion and said edge portion of said second substrate retained by said second substrate retention portion are supported by said substrate lower guard member;

a substrate recognizing means for detecting a position of said first substrate retained by said first substrate retention portion and a position of said second substrate retained by said second substrate retention portion;

a positioning control means for controlling said substrate positioning mechanism based on a position detection result of said substrate recognizing means;

a plurality of pressure generating means disposed individually in said first elevating portion and said second elevating portion so as to apply downward forces to said elevating portions respectively;

a descending limit position regulating member for regulating a lower limit position of said first elevating portion so as to regulate height of said pressure bonding surface of said first pressure bonding tool and regulating a lower limit position of said second elevating portion so as to regulate height of said pressure bonding surface of said second pressure bonding tool to thereby keep said pressure bonding surface of said second pressure bonding tool at a higher position than said first pressure bonding surface; and an elevating means for changing height of said lower limit position regulating member so as to bring said pressure bonding surface of said first pressure bonding tool into contact with an electronic component on said first substrate supported by said lower guard member and apply thereto a force from corresponding one of said pressure generating means, and so as to bring said pressure bonding surface of said second pressure bonding tool into contact with an electronic component on said second substrate supported by said lower guard member and apply thereto a force from corresponding one of said pressure generating means.

7. A pressure bonding machine according to claim 6, wherein said substrates are display panels, and said electronic components are drivers for driving said display panels.

8. A pressure bonding machine according to claim 6, wherein said substrates are display panels, and said electronic components are connectors for connecting said display panels to other circuit modules.

* * * * *